United States Patent
Wang et al.

(10) Patent No.: US 12,041,863 B2
(45) Date of Patent: Jul. 16, 2024

(54) RESISTIVE RANDOM ACCESS MEMORY (RRAM) STRUCTURE AND FORMING METHOD THEREOF

(71) Applicant: UNITED MICROELECTRONICS CORP., Hsin-Chu (TW)

(72) Inventors: Wen-Jen Wang, Tainan (TW); Chun-Hung Cheng, Kaohsiung (TW); Chuan-Fu Wang, Miaoli County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 614 days.

(21) Appl. No.: 17/159,160

(22) Filed: Jan. 27, 2021

(65) Prior Publication Data
US 2022/0209112 A1 Jun. 30, 2022

(30) Foreign Application Priority Data
Dec. 30, 2020 (CN) .......................... 202011604690.3

(51) Int. Cl.
*H01L 45/00* (2006.01)
*H10B 63/00* (2023.01)
*H10N 70/00* (2023.01)

(52) U.S. Cl.
CPC ......... *H10N 70/8833* (2023.02); *H10B 63/00* (2023.02); *H10N 70/023* (2023.02); *H10N 70/063* (2023.02); *H10N 70/841* (2023.02)

(58) Field of Classification Search
CPC ..................................................... H10N 70/826
See application file for complete search history.

(56) References Cited

U.S. PATENT DOCUMENTS

| 9,431,604 | B2 | 8/2016 | Liao | |
| 10,153,432 | B2* | 12/2018 | Zhu | ...................... H10N 70/826 |
| 2018/0331282 | A1 | 11/2018 | Zhu | |

* cited by examiner

*Primary Examiner* — Mark V Prenty
(74) *Attorney, Agent, or Firm* — Winston Hsu

(57) ABSTRACT

A resistive random access memory (RRAM) structure includes a RRAM cell, spacers and a dielectric layer. The RRAM cell is disposed on a substrate. The spacers are disposed beside the RRAM cell, wherein widths of top surfaces of the spacers are larger than or equal to widths of bottom surfaces of the spacers. The dielectric layer blanketly covers the substrate and sandwiches the RRAM cell, wherein the spacers are located in the dielectric layer. A method for forming said resistive random access memory (RRAM) structure is also provided.

14 Claims, 5 Drawing Sheets

RESISTIVE RANDOM ACCESS MEMORY (RRAM) STRUCTURE AND FORMING METHOD THEREOF

BACKGROUND OF THE INVENTION

Field of the Invention

The present invention relates generally to a resistive random access memory (RRAM) structure and forming method thereof, and more specifically to a resistive random access memory (RRAM) structure including filling spacers and forming method thereof.

Description of the Prior Art

In semiconductor processes, a resistive random-access memory is composed of two upper and lower metal electrodes and a transition metal oxide (TMO). The operating theory is to use the variable resistance of the transition metal oxide. The applied bias voltage changes to induce different resistance values, and the internal stored value is determined by the internal resistance.

SUMMARY OF THE INVENTION

The present invention provides a resistive random access memory (RRAM) structure and forming method thereof, which fills spacers in a dielectric layer beside a RRAM cell, to avoid the spacers from being over-etched and thus prevent a resistive layer of the RRAM cell from being exposed.

The present invention provides a resistive random access memory (RRAM) structure including a RRAM cell and spacers. The RRAM cell is disposed on a substrate. The spacers are disposed beside the RRAM cell, wherein widths of top surfaces of the spacers are larger than or equal to widths of bottom surfaces of the spacers.

The present invention provides a resistive random access memory (RRAM) forming method including the following steps. A RRAM cell is formed on a substrate. A dielectric layer is deposited to blanketly cover the substrate beside the RRAM cell. The dielectric layer is etched to form recesses in the dielectric layer beside the RRAM cell. Spacers fill into the recesses.

According to the above, the present invention provides a resistive random access memory (RRAM) structure and forming method thereof, which forms a RRAM cell on a substrate, deposits a dielectric layer blanketly covering the substrate beside the RRAM cell, etches the dielectric layer to form recesses in the dielectric layer beside the RRAM cell, and fills spacers into the recesses. By filling the spacers into the recesses of the dielectric layer, over-etching of the spacers can be avoided, and thus short circuit caused by the exposure of a resistive layer of the RRAM cell can be prevented.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
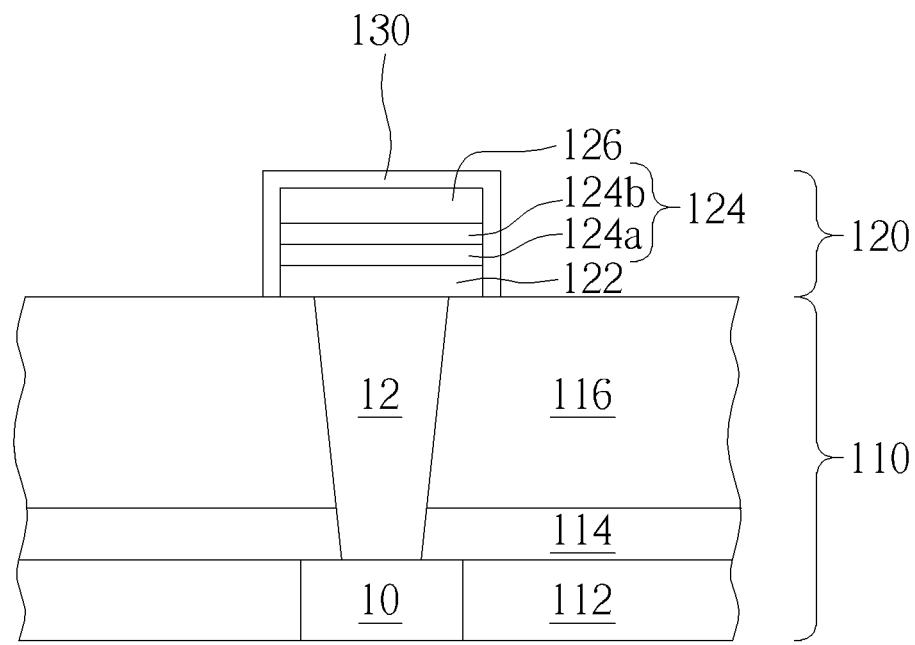
FIG. 1 schematically depicts a cross-sectional view of a resistive random access memory (RRAM) forming method according to an embodiment of the present invention.

FIGS. 1-5 schematically depict cross-sectional views of a resistive random access memory (RRAM) forming method according to an embodiment of the present invention. A RRAM cell 120 is formed on a substrate 110. In this embodiment, the substrate 110 includes a ultra-low k dielectric layer 112, a nitrogen containing silicon carbide (SiCN) layer 114 and a silicon oxide layer 116 stacked on the substrate (not shown) from bottom to top, but it is not limited thereto. A metal interconnect 10 is disposed in the ultra-low k dielectric layer 112, and a via 12 is disposed in the nitrogen containing silicon carbide (SiCN) layer 114 and the silicon oxide layer 116. Two ends of the via 12 directly contact the RRAM cell 120 and the metal interconnect 10 in the ultra-low k dielectric layer 112 respectively.

In this embodiment, the RRAM cell 120 may include a bottom electrode 122, a resistive material layer 124 and a top electrode 126 stacked from bottom to top. In a preferred embodiment, the resistive material layer 124 may include a tantalum oxide layer 124a and an iridium (Ir) layer 124b, but it is not limited thereto.

Figure 2:
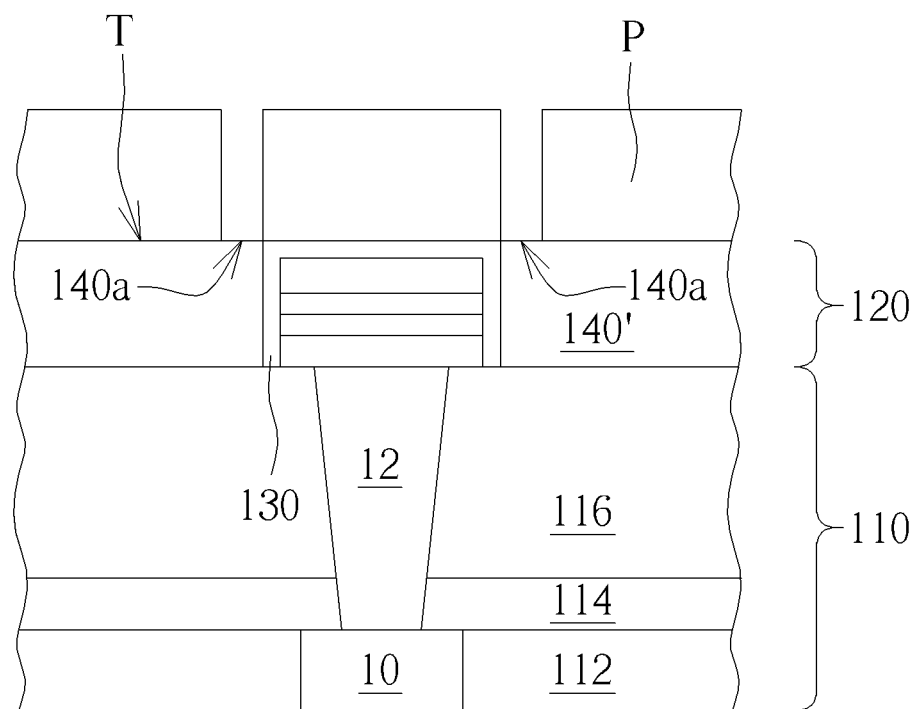
FIG. 2 schematically depicts a cross-sectional view of a resistive random access memory (RRAM) forming method according to an embodiment of the present invention.

In a preferred embodiment, an oxide layer 130 is selectively formed to conformally cover the RRAM cell 120 for protecting the RRAM cell 120 in later processes. As shown in FIG. 2, a dielectric layer 140' is deposited to cover the substrate 110 beside the RRAM cell 120 blanketly, wherein the dielectric layer 140' has a flat top surface T. Methods of forming the dielectric layer 140' may include the following, but the present invention is not restricted thereto. A dielectric layer (not shown) is deposited blanketly to cover the substrate 110 and the RRAM cell 120. The dielectric layer is then planarized by processes such as a chemical mechanical polishing (CMP) process until the RRAM cell 120 being exposed, so that the dielectric layer 140' having the flat top surface T is formed on the substrate 110 beside the RRAM cell 120. In one case, the dielectric layer 140' may be an ultra-low k dielectric layer 112, but it is not limited thereto.

Figure 3:
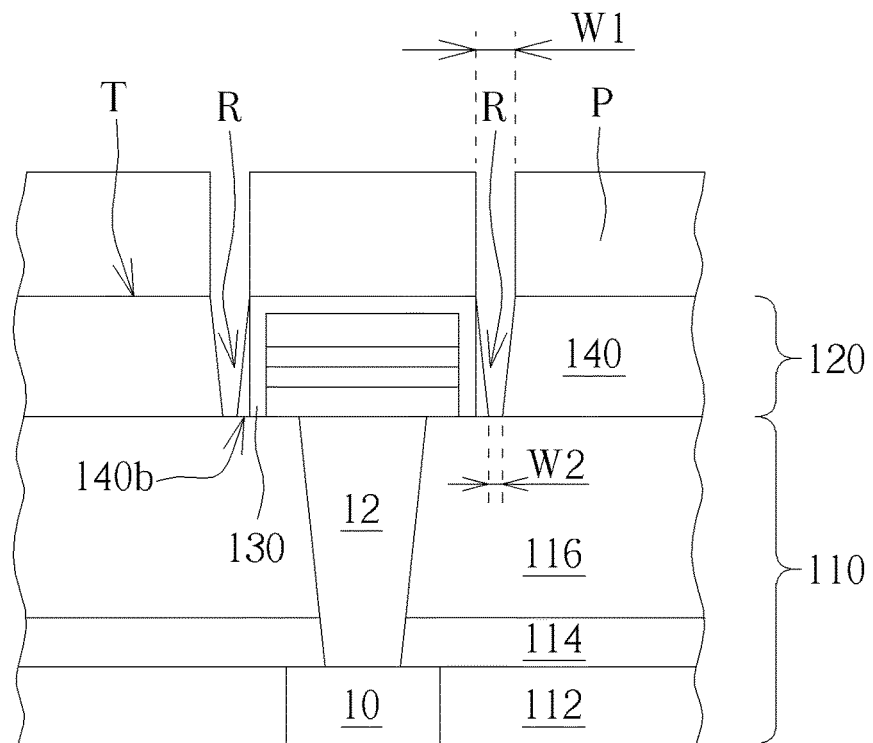
FIG. 3 schematically depicts a cross-sectional view of a resistive random access memory (RRAM) forming method according to an embodiment of the present invention.

Please refer to FIGS. 2-3, the dielectric layer 140' is etched to form recesses R in a dielectric layer 140 beside the RRAM cell 120. As shown in FIG. 2, a patterned photoresist P is formed to cover the dielectric layer 140' and expose parts 140a for forming the recesses R. The dielectric layer 140' is etched to remove the parts 140a, and thus the recesses R are formed in the dielectric layer 140 beside the RRAM cell 120, as shown in FIG. 3. Thereafter, the patterned photoresist P is removed.

In this embodiment, widths W1 of openings of the recesses R are larger than widths W2 of bottom parts of the recesses R, for a spacer material filling into the recesses R easily. In this case, parts 140b of the dielectric layer 140 right next to the RRAM cell 120 remain. In another embodiment, the widths W1 of the openings of the recesses R are equal to the widths W2 of the bottom parts of the recesses R, depending upon practical requirements.

Figure 4:
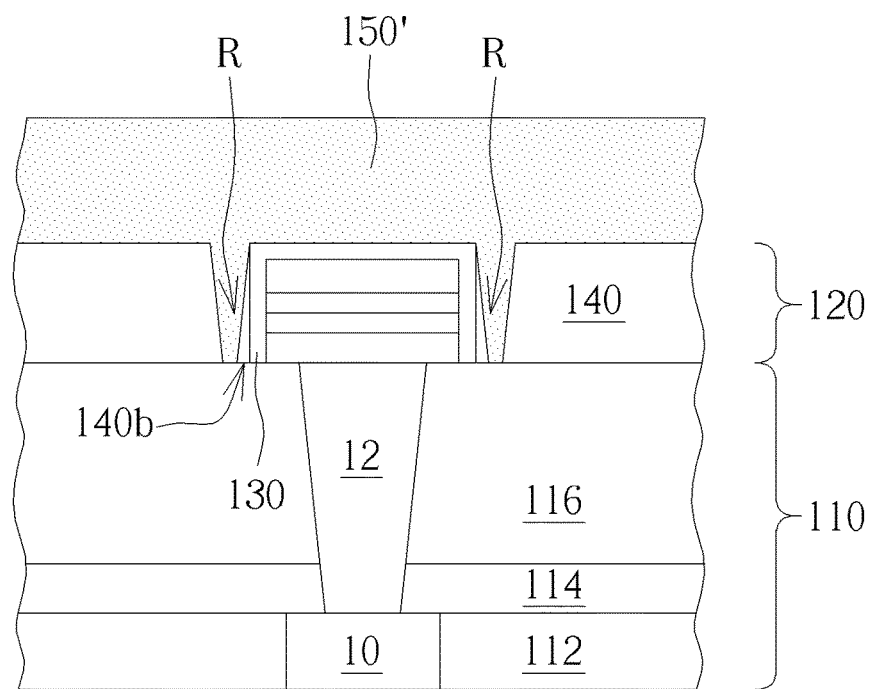
FIG. 4 schematically depicts a cross-sectional view of a resistive random access memory (RRAM) forming method according to an embodiment of the present invention.
Figure 5:
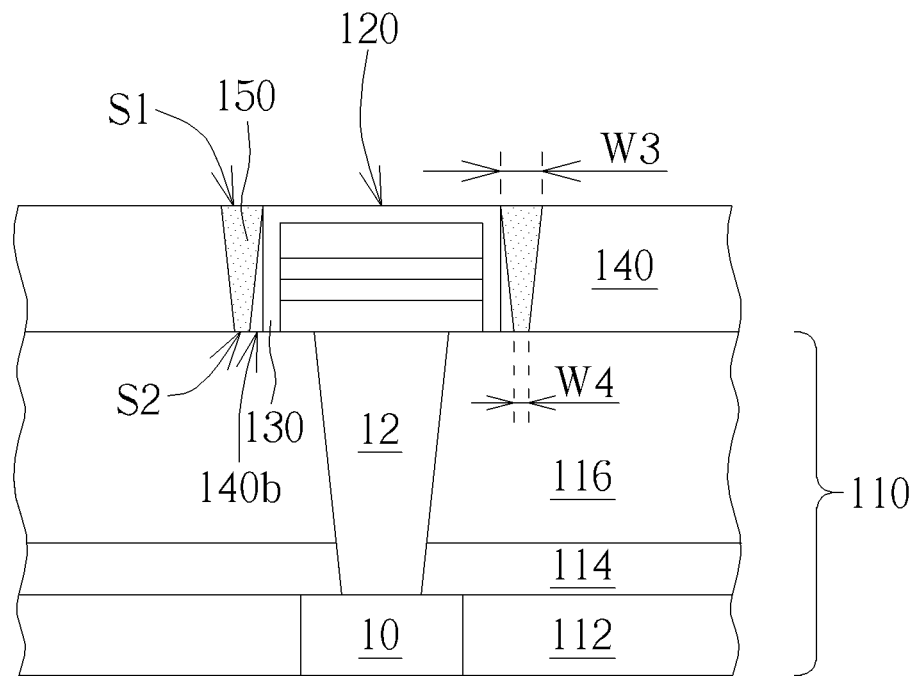
FIG. 5 schematically depicts a cross-sectional view of a resistive random access memory (RRAM) forming method according to an embodiment of the present invention.

Please refer to FIGS. 4-5, spacers 150 fill into the recesses R. More precisely, as shown in FIG. 4, a spacer material 150' is deposited in the recesses R and on the dielectric layer 140. As shown in FIG. 5, the spacer material 150' exceeding from the recesses R is removed, to form the spacers 150 in the recesses R. Preferably, the spacer material 150' is formed by an atomic layer deposition (ALD) process for filling the spacer material 150' into the recesses R easily. In this way, the spacers 150 in this embodiment are pillar shape spacers. The spacers 150 may include materials such as silicon nitride (SiN), silicon carbide (SiC), nitrogen containing silicon carbide (SiCN) or carbon containing silicon oxynitride (SiCNO) etc. Due to the spacers 150 filling into the recesses R of the dielectric layer 140 after the dielectric layer 140 is formed, over-etching of the spacers formed before a dielectric layer is formed in current processes can be avoided, and thus short circuit caused by the exposure of a resistive layer of the RRAM cell can be prevented.

Since the widths W1 of the openings of the recesses R are larger than the widths W2 of the bottom parts of the recesses R, widths W3 of top surfaces S1 of the spacers 150 are also larger than widths W4 of bottom surfaces S2 of the spacers 150. In a preferred embodiment, the spacers 150 have oblique sidewalls broaden from bottom to top, but it is not limited thereto. In a still preferred embodiment, the spacers 150 have trapezoidal shape cross-sectional profiles. In this case, the substrate 110 is exposed by the recesses R and the parts 140b of the dielectric layer 140 are reserved after the dielectric layer 140 is etched, therefore the spacers 150 of FIG. 5 directly contacting the substrate 110 and the parts 140b of the dielectric layer 140 being located between the RRAM cell 120 and the spacers 150.

Figure 6:
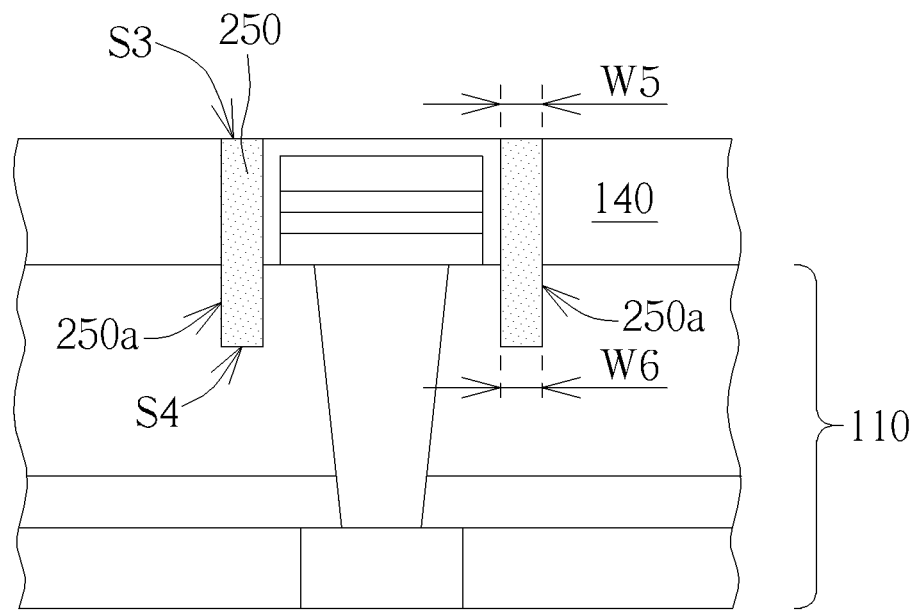
FIG. 6 schematically depicts a cross-sectional view of a resistive random access memory (RRAM) structure according to an embodiment of the present invention.

Another embodiment is presented as follows. FIG. 6 schematically depicts a cross-sectional view of a resistive random access memory (RRAM) structure according to an embodiment of the present invention. The dielectric layer 140' of FIG. 2 is etched and the recesses R of FIG. 3 extend to the substrate 110, and thereby bottom parts of spacers 250 filling into the recesses R extend to the substrate 110, as shown in FIG. 6. In this case, widths W5 of top surfaces S3 of the spacers 250 are equal to widths W6 of bottom surfaces S4 of the spacers 250, and the spacers 250 have rectangular shape cross-sectional profiles, but it is not limited thereto.

Figure 7:
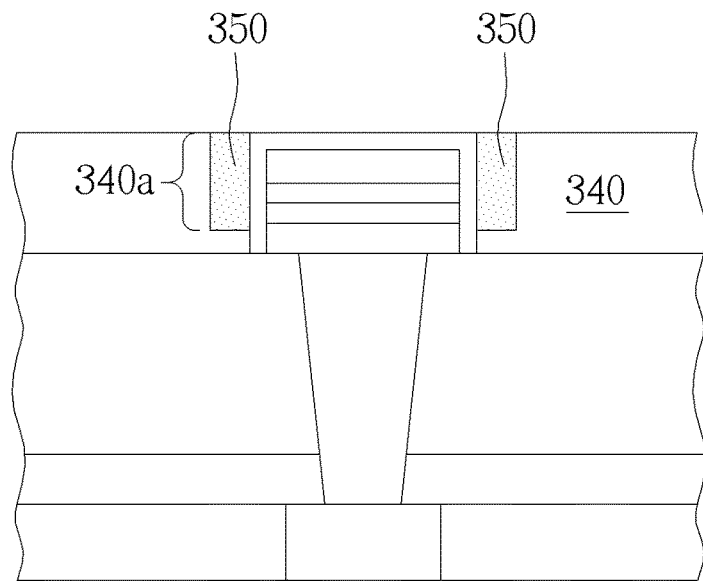
FIG. 7 schematically depicts a cross-sectional view of a resistive random access memory (RRAM) structure according to an embodiment of the present invention.

Still another embodiment is presented as follows. FIG. 7 schematically depicts a cross-sectional view of a resistive random access memory (RRAM) structure according to an embodiment of the present invention. Only parts of the dielectric layer 140' of FIG. 2 is etched, so that spacers 350 of FIG. 7 are only disposed in top parts 340a of a dielectric layer 340, depending upon a formed structure.

Above all, a method of forming the RRAM cell 120 includes depositing the dielectric layer 140' having the flat top surface T to cover the substrate 110 beside the RRAM cell 120 blanketly, etching the dielectric layer 140' to form the recesses R by the patterned photoresist P, and filling the spacers 150 into the recesses R. Another method of forming the RRAM cell 120 may include forming gaps (not shown) between the oxide layer 130 and the dielectric layer 140', or between the RRAM cell 120 and the dielectric layer 140' by selecting slurry of CMP (chemical mechanical polishing) processes for planarizing the dielectric layer after the dielectric layer (not shown) is deposited to cover the RRAM cell 120 and the substrate 110, therefore spacers can filling into the gaps.

Figure 8:
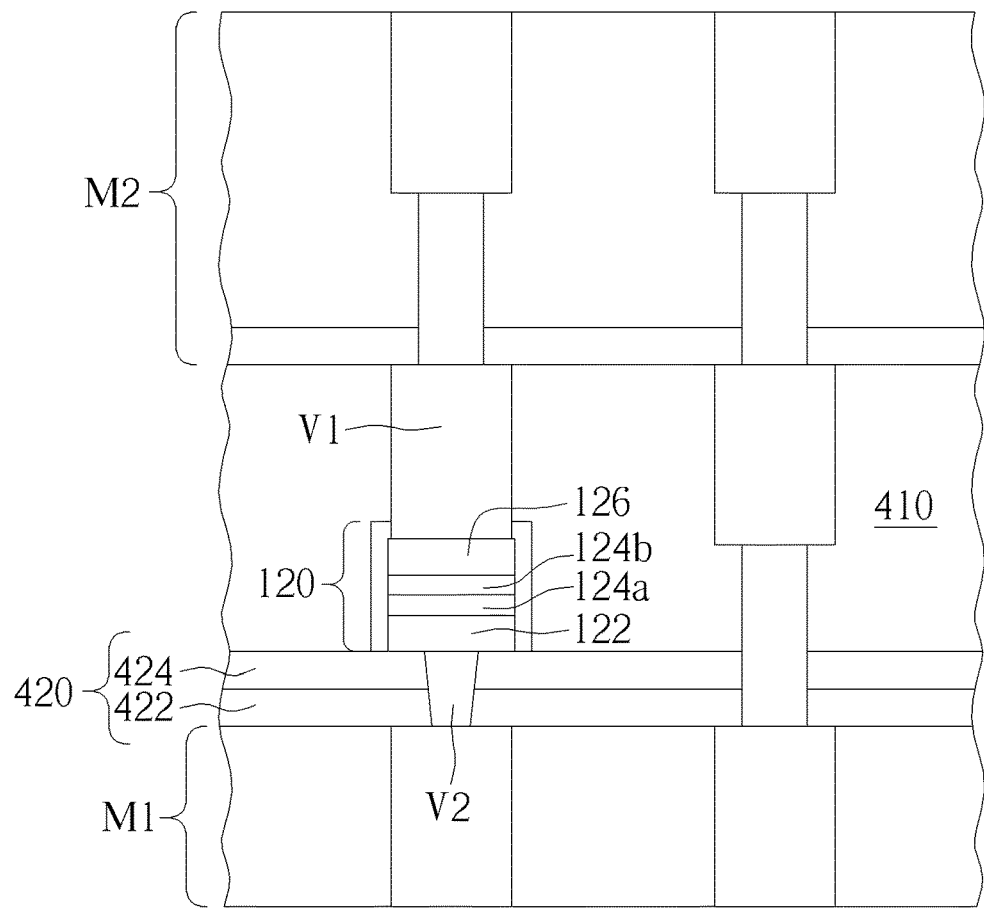
FIG. 8 schematically depicts a cross-sectional view of a metal interconnect according to an embodiment of the present invention.

An embodiment of a metal interconnect applying the RRAM cell 120 of the present invention is presented as follows, but the present invention is not restricted thereto. FIG. 8 schematically depicts a cross-sectional view of a metal interconnect according to an embodiment of the present invention. As shown in FIG. 8, a dielectric layer 410 is an inter-metal dielectric (IMD) layer stacked between a metal interconnect M1 and a metal interconnect M2. In this embodiment, the RRAM cell 120 is disposed in the dielectric layer 410. A metal V1 is located in the dielectric layer 410 and directly contacts the top electrode 126. A bottom via V2 is disposed in a dielectric layer 420 between the metal interconnect M1 and the dielectric layer 410, and the bottom via V2 directly contacts the bottom electrode 122. The dielectric layer 420 may include a nitrogen containing silicon carbide (SiCN) layer 422 and a plasma enhanced oxide (PEOX) layer 424 etc.

Figure 9:
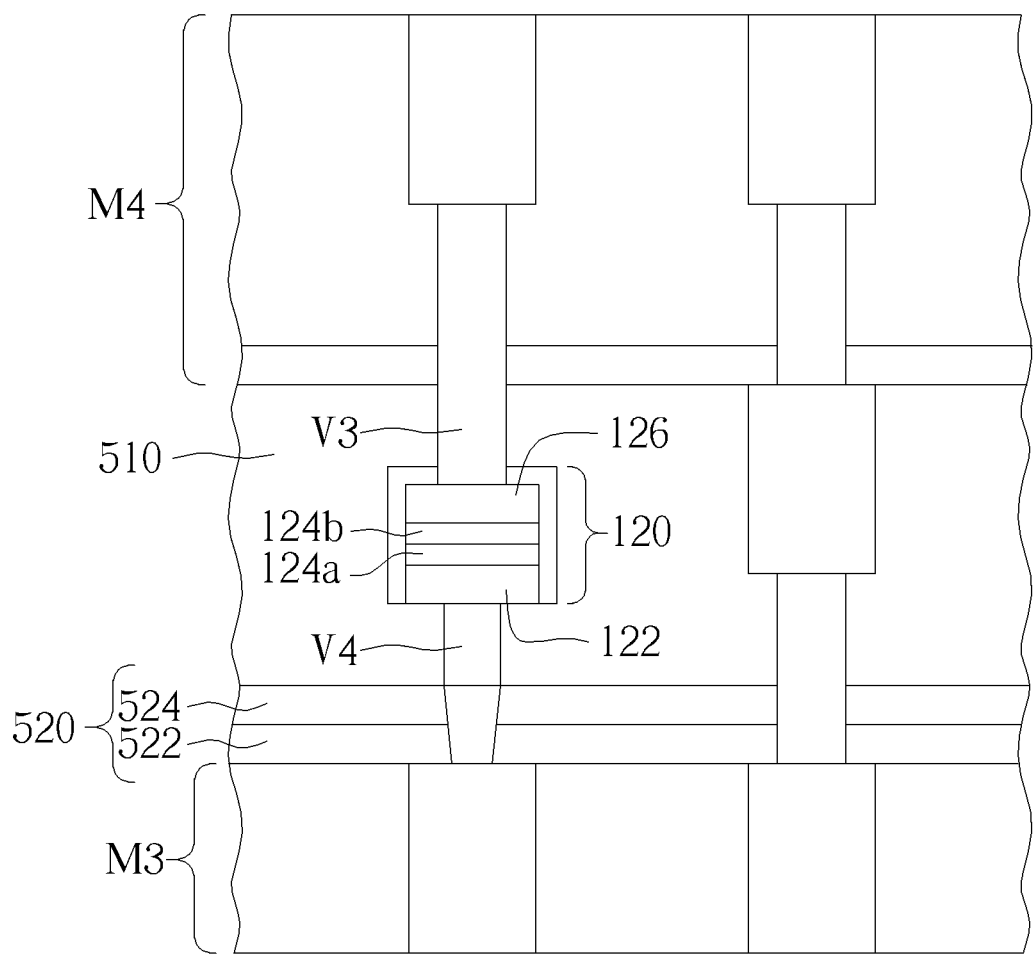
FIG. 9 schematically depicts a cross-sectional view of a metal interconnect according to an embodiment of the present invention.

Another embodiment of a metal interconnect applying the RRAM cell 120 of the present invention is presented as follows. FIG. 9 schematically depicts a cross-sectional view of a metal interconnect according to an embodiment of the present invention. As shown in FIG. 9, a dielectric layer 510 is an inter-metal dielectric (IMD) layer stacked between a metal interconnect M3 and a metal interconnect M4. In this embodiment, the RRAM cell 120 is disposed in the dielectric layer 510. A top via V3 in the dielectric layer 510 extends from the metal interconnect M4 to the top electrode 126, and directly contacts the top electrode 126. A bottom via V4 is in the dielectric layer 510, directly contacts the bottom electrode 122, and connects the bottom via V2, wherein the bottom via V4 is located in a dielectric layer 520 between the metal interconnect M3 and the dielectric layer 510. The dielectric layer 520 may include a nitrogen containing silicon carbide (SiCN/NDC) layer 522 and a plasma enhanced oxide (PEOX) layer 524 etc.

To summarize, the present invention provides a resistive random access memory (RRAM) structure and forming method thereof, which forms a RRAM cell on a substrate, deposits a dielectric layer blanketly covering the substrate beside the RRAM cell, etches the dielectric layer to form recesses in the dielectric layer beside the RRAM cell, and fills spacers into the recesses. By filling the spacers into the recesses of the dielectric layer after the dielectric layer is formed, over-etching of the spacers can be avoided, and thus short circuit caused by the exposure of a resistive layer of the RRAM cell can be prevented.

Moreover, widths of top surfaces of the spacers are larger than or equal to widths of bottom surfaces of the spacers, therefore the spacers can filling into the recesses in the dielectric layer easily. The spacers may be pillar shape spacers, which have rectangular shape cross-sectional profiles, or have oblique sidewalls broaden from bottom to top. Preferably, the spacers have trapezoidal shape cross-sectional profiles. The spacers of the present invention may directly contact the substrate, extend to the substrate, or only disposed in top parts of the dielectric layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive random access memory (RRAM) structure, comprising:
 a RRAM cell disposed on a substrate; and
 spacers disposed beside the RRAM cell, wherein widths of top surfaces of the spacers are larger than widths of bottom surfaces of the spacers, wherein the spacers have oblique sidewalls broaden from bottom to top.

2. The resistive random access memory (RRAM) structure according to claim 1, further comprising:
 a dielectric layer blanketly covering the substrate and sandwiching the RRAM cell, wherein the spacers are located in the dielectric layer, and the dielectric layer comprises an ultra-low k dielectric layer.

3. The resistive random access memory (RRAM) structure according to claim 1, wherein the spacers comprise pillar shape spacers.

4. The resistive random access memory (RRAM) structure according to claim 1, wherein the spacers have trapezoidal shape cross-sectional profiles.

5. The resistive random access memory (RRAM) structure according to claim 1, wherein the spacers directly contact the substrate.

6. The resistive random access memory (RRAM) structure according to claim 5, wherein a bottom part of each of the spacers extends to the substrate.

7. The resistive random access memory (RRAM) structure according to claim 2, wherein the spacers are only in top parts of the the dielectric layer.

8. The resistive random access memory (RRAM) structure according to claim 1, wherein the spacers comprise silicon nitride (SiN), silicon carbide (SiC), nitrogen containing silicon carbide (SiCN), carbon containing silicon oxynitride (SiCNO).

9. The resistive random access memory (RRAM) structure according to claim 1, further comprising:
 an oxide layer conformally covering the RRAM cell.

10. The resistive random access memory (RRAM) structure according to claim 1, wherein the substrate comprises an ultra-low k dielectric layer, a nitrogen containing silicon carbide (SiCN) layer and a silicon oxide layer stacked from bottom to top.

11. The resistive random access memory (RRAM) structure according to claim 10, further comprising:
 a via disposed in the silicon oxide layer and the nitrogen containing silicon carbide (SiCN) layer, and directly contacting the RRAM cell, and a metal interconnect disposed in the ultra-low k dielectric layer and directly contacting the via.

12. The resistive random access memory (RRAM) structure according to claim 2, wherein the RRAM cell comprises a bottom electrode, a resistive material layer and a top electrode stacked from bottom to top.

13. The resistive random access memory (RRAM) structure according to claim 12, further comprising:
 a top via and a bottom via, and the top via, the bottom via and the RRAM cell disposed in the dielectric layer, wherein the top via contacts the top electrode and the bottom via contacts the bottom electrode.

14. The resistive random access memory (RRAM) structure according to claim 2, wherein a part of the dielectric layer is between the spacers and the RRAM cell.

* * * * *